United States Patent [19]
Klass et al.

[11] Patent Number: 5,880,609
[45] Date of Patent: Mar. 9, 1999

[54] NON-BLOCKING MULTIPLE PHASE CLOCKING SCHEME FOR DYNAMIC LOGIC

[75] Inventors: Edgardo F. Klass, Palo Alto; David W. Poole, Mountain View; Gary R. Gouldsberry, Cupertino, all of Calif.

[73] Assignee: Sun Microsystems, Inc., Palo Alto, Calif.

[21] Appl. No.: 788,710

[22] Filed: Jan. 23, 1997

[51] Int. Cl.$^6$ ..................................................... H03K 19/00
[52] U.S. Cl. ................................................. 326/93; 326/96
[58] Field of Search .................................. 326/93, 96, 97, 326/98; 327/144, 233, 295

[56] References Cited

U.S. PATENT DOCUMENTS

| | | | |
|---|---|---|---|
| 5,434,520 | 7/1995 | Yetter et al. | 326/97 |
| 5,504,441 | 4/1996 | Sigal | 326/96 |
| 5,541,536 | 7/1996 | Rajivan | 326/98 |

FOREIGN PATENT DOCUMENTS

| | | | |
|---|---|---|---|
| 6-197006 (A) | 7/1994 | Japan | 326/98 |

OTHER PUBLICATIONS

Wang, J.S., et al., "Novel Dynamic CMOS Logic Free From Problems of Charge Sharing and Clock Skew," *International Journal of Electronics*, vol. 66, No. 5, pp. 679–695, May 1989.

Gaddis, N.B. et al., "A 56–Entry Instruction Reorder Buffer", *1996 IEEE International Solid–State Circuits Conference*, pp. 212–213, (1996).

Partovi, H. et al., "Flow–Through Latch and Edge–Triggered Flip–Flop Hybrid Elements", *ISSCC Slide Supplement*, p. 104, (1996).

Shoji, Masakazu, *CMOS Digital Circuit Technology*, Prentice Hall, NJ, pp. 216–217, (1988).

Yuan, Jiren et al., "A True Single–Phase–Clock Dynamic CMOS Circuit Technique", *IEEE Journal Of Solid–State Circuits*, vol. 22, Oct. 1987, pp. 899–901.

Yuan, Jiren et al., "High–Speed CMOS Circuit Technique", *IEEE Journal Of Solid–State Circuits*, vol. 24., Feb. 1989, pp. 62–70.

*Primary Examiner*—Michael J. Tokar
*Assistant Examiner*—Don Phu Le
*Attorney, Agent, or Firm*—Forrest Gunnison

[57] ABSTRACT

A non-blocking multiple-phase clocking system for use with dynamic logic provides clock phases with overlapping evaluation phases to a circuit including a several cascaded dynamic logic gates. The circuit also includes a first flip-flop that is coupled to provide input signal(s) to the first dynamic logic gate of the cascade and a second flip-flop that is coupled to receive output signal(s) from the last dynamic logic gate of the cascade. Through the use of the overlapping evaluation phases and proper assignment of the clock signals to the dynamic logic gates, the output signal(s) generated by the dynamic logic gates receiving a particular clock phase are used as input signals to the dynamic logic gates receiving the next clock phase. Because of the overlapping of the clock phases, no latch is used. The clock phases are assigned to a particular dynamic logic gate so that the this dynamic logic gate enters the evaluation phase before the input signal(s) to the particular dynamic logic gate arrives (i.e., a "non-blocking") manner so that delay through the dynamic logic circuit can be minimized. To ensure that valid output signals are received by the dynamic logic gates receiving the next clock phase, the clock phases are assigned so that this particular dynamic logic gate receives its input signal(s) before the start of the evaluation phase of any subsequent clock phase.

20 Claims, 7 Drawing Sheets

NON-BLOCKING MULTIPLE PHASE CLOCKING SCHEME FOR DYNAMIC LOGIC

FIELD OF THE INVENTION

The present invention relates to clocking systems and, more particularly, to clocking schemes for circuits with dynamic logic gates.

Background

Some high performance circuits such as, for example, microprocessors, are implemented using dynamic logic gates. As is well known, dynamic logic gates in general allow the design of faster circuits compared to conventional CMOS circuits. Generally, dynamic logic gates operate in a precharge phase and an evaluation phase. For example, FIG. 1 schematically illustrates a typical conventional dynamic logic gate 100 of the domino type. In this example, the logic gate 100 implements a three-input AND gate. The logic gate 100 includes a precharge p-channel transistor PC and an evaluation n-channel transistor EV, each having a gate coupled to receive a clock signal CK. The logic gate 100 also includes three n-channel transistors N1–N3 connected in series (i.e. with channel regions connected end-to-end) between the drains of the precharge and evaluation transistors PC and EV. The gates of these three n-channel transistors are connected to respectively receive three input signals A, B, and C. The drain of the precharge transistor PC is also connected to a CMOS inverter 102 (implemented by a p-channel transistor P1 and a n-channel transistor N4) through a node OUTN. The CMOS inverter 102 provides an output signal OUT at an output lead 104.

FIG. 2 is a timing diagram illustrating the operation of the logic gate 100. Although the operation of the logic gate 100 is well known to those skilled in the art of dynamic logic gates, the following description is provided for completeness. A falling edge of the clock signal CK initiates a precharge phase by turning on the precharge p-channel transistor PC and turning off the evaluation n-channel transistor EV. Consequently, during the precharge phase, the precharge transistor PC pulls up the voltage at the node OUTN, thereby causing the CMOS inverter 102 to generate the output signal OUT with a logic low level.

In contrast, a rising edge of the clock signal CK causes the logic gate 100 to enter the evaluation phase by turning off the precharge transistor PC and turning on the evaluation transistor EV. As a result, during the evaluation phase, the precharge transistor PC no longer pulls up the voltage at the node OUTN. In addition, the series connected n-channel transistors N1–N3 and the evaluation transistor EV can implement a conductive path between the node OUTN and ground (e.g., the VSS voltage source). In this example, the input signals A, B, and C all transition to a logic high level during the evaluation phase, thereby causing the n-channel transistors N1–N3 to turn on and discharge the node OUTN. Accordingly, the inverter 102 causes the output signal OUT to transition to a logic high level. Of course, had one or more of the input signals A-C remained at a logic low level during this evaluation phase, the pulldown path would have remained open-circuited, causing the node OUTN and the output signal OUT to remain at a logic high and logic low level, respectively.

FIG. 3 illustrates an exemplary logic subcircuit 300 implemented with interconnected dynamic logic gates 301–306. A flip-flop circuit 308 is connected to provide one or more input signals to the dynamic logic gates 301–306. A flip-flop circuit 310 is connected to receive one or more output signals generated by the dynamic logic gates 301–306. It is understood that large numbers of subcircuits similar to the logic subcircuit 300 can be interconnected to form a complex circuit such as a microprocessor. A single clock signal CK is used to clock all of the logic gates and flip-flop circuits of the logic subcircuit 300. As a result, while the clock signal CK is at a logic low level (i.e., during the precharge phase), no logic function is performed by the logic subcircuit 300. Because the precharge phase of a typical dynamic flip-flop requires about 20%–30% of the cycle time, only about 70%–80% of each clock cycle is available for logic operation. The "wasted" 20%–30% results in sub-optimal operation of the logic circuit 300 from a logic operation perspective.

One conventional scheme to more efficiently use each clock cycle is illustrated in FIG. 4. In this scheme, a logic subcircuit 400 is configured so that the flip-flop circuit 308 and the dynamic logic gates 301–303 are connected to receive a first clock signal CK1. The logic gate 303 is connected to provide one or more output signals to a rising edge triggered latch 401, which in turn provides one or more output signals to the dynamic logic gates 304–306. The latch 401 and the logic gates 304–306 are clocked with a second clock signal CK2.

In this type of scheme, the clock signals CK1 and CK2 implement a "non-overlapping" two-phase clocking system. More specifically, as shown in FIG. 5, the clock signal CK2 is the complement of the clock signal CK1. Thus, the precharge and evaluation phases of the clock signal CK1, respectively, do not overlap the precharge and evaluation of the clock signal CK2. Because the clock signals do not overlap, the logic gates driven by the latch 401 will be operating in the precharge phase when the logic gates driven by the flip-flop circuit 308 are operating in the evaluation phase and vice versa. Thus, for example, when the clock signal CK1 is at a logic high level, the logic gates 301–303 perform a logic function on the input signals provided by the flip-flop circuit 308. During this time period, the latch 401 receives the clock signal CK2 with a logic low level, which causes the latch 401 to be disabled. Then, when the clock signals CK1 and CK2, respectively, transition to the logic low and logic high levels, the output signal(s) of the logic gates 301–303 are latched by the latch 401 and provided to the logic gates 304–306, which are now in the evaluation phase. Unlike the logic subcircuit 300 (FIG. 3), this scheme allows the logic subcircuit 400 to perform logic operations during the entire cycle time by "hiding" the precharge time of one group of logic gates during the evaluation phase of the other group of logic gates.

However, the non-overlapping two-phase clocking system has several shortcomings. For example, the latch 401 undesirably increases the propagation delay of the subcircuit by about one gate delay. In addition, skew and jitter between the clock signals CK1 and CK2 is generally accounted for by increasing the set-up time of the latch, resulting in a wasted use of a portion of the cycle time. That is, the latency of the latch 401, in effect, takes time out of the cycle time, thereby reducing the time available in the cycle time for performing logic operations.

Still further, as is well known in the art of dynamic logic, the latch 401 in conjunction with the complementary two phase clocking causes the so-called "quantization effect" which results when the "first" group of logic gates (i.e., logic gates 301–303 in this example) does not have substantially the same propagation delay as the "second" group of logic gates (i.e., logic gates 304–306 in this example). Perfect balance is hard to achieve in practice because of the quantized nature of gate delays. This quantization effect may add up to a gate delay penalty. The combined time penalties due to the insertion of the latch 401 are between approximately two and three gate delays. Thus, there is a need for a dynamic logic clocking system that efficiently uses the entire cycle time for logic operations without the time penalties of the non-overlapped two-phase clocking system.

Summary

In accordance with the present invention, a non-blocking multiple-phase clocking system is provided for use with dynamic logic. In one embodiment, a clock generator provides clock signals (alternatively referred to herein as clock phases) with overlapping evaluation phases to a circuit or subcircuit including a group of interconnected dynamic logic gates. The circuit also includes a first flip-flop that is coupled to provide one or more input signals to the group of dynamic logic gates and a second flip-flop that is coupled to receive one or more output signals from the group of dynamic logic gates.

For example, in a three phase embodiment, the first clock signal is provided to the first flip-flop and a first set of dynamic logic gates (i.e., with at least one dynamic logic gate). The second clock signal is provided to a second set of dynamic logic gates so that the second clock signal lags the first clock signal, with the evaluation phase of the second clock signal overlapping the evaluation phase of the first clock signal. Likewise, the third clock signal is provided to a third set of dynamic logic gates so that the third clock signal lags the second clock signal with overlapping evaluation phases.

Through the use of the overlapping evaluation phases and proper assignment of the clock signals to the dynamic logic gates, the output signal(s) generated by the first set of dynamic logic gates are used as input signals to the first set or the second set of dynamic logic gates. Similarly, the output signal(s) generated by the second set of logic gates can be used as input signals to the second set or the third set of logic gates. Because of the overlapping of the clock signals, no latch is used. As a result, the shortcomings described above arising from the use of a latch and non-overlapping clock signals are avoided.

In a further aspect of the present invention, the clock signals are assigned to a particular dynamic logic gate so that the this dynamic logic gate enters the evaluation phase before the critical input signal(s) to the particular dynamic logic gate arrives. The term "critical input signal" is used herein to refer to the latest arriving input signal to a particular dynamic logic gate. Unlike conventional non-overlapped two-phase clocking systems, this feature allows for the dynamic logic gate to immediately operate on the critical input signal(s) in a "non-blocking" manner so that critical signals can propagate through the dynamic logic circuit without the additional time penalties associated with the insertion of latches. In addition, to ensure that valid output signals are received by the next set of downstream dynamic logic gates, the clock signals are assigned so that this particular dynamic logic gate receives its critical input signal(s) after the start of the evaluation phase of the assigned clock signal but before the start of the evaluation phase of any subsequent clock signal. More specifically, by assigning the clock signals so that each dynamic logic gate receives its critical input signal(s) before the start of the evaluation phase of any subsequent clock signal, the dynamic logic gate will generate its slowest output signal with at least the minimum pulse width required by the receiving dynamic logic gate(s).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
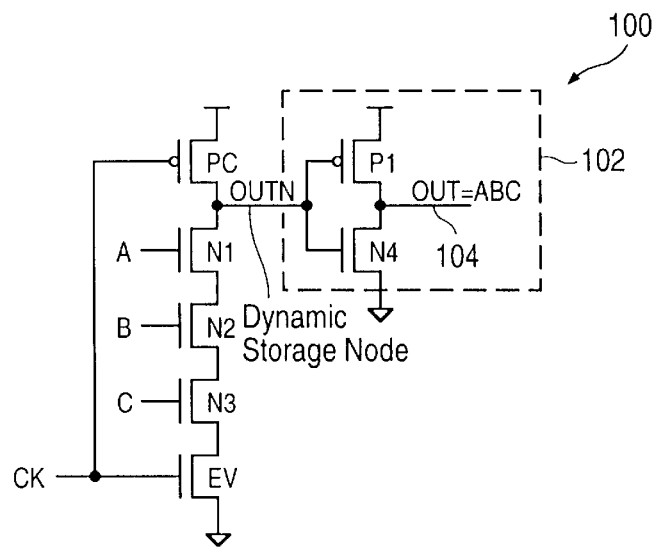
FIG. 1 is a schematic diagram of an exemplary conventional dynamic logic gate.
Figure 2:
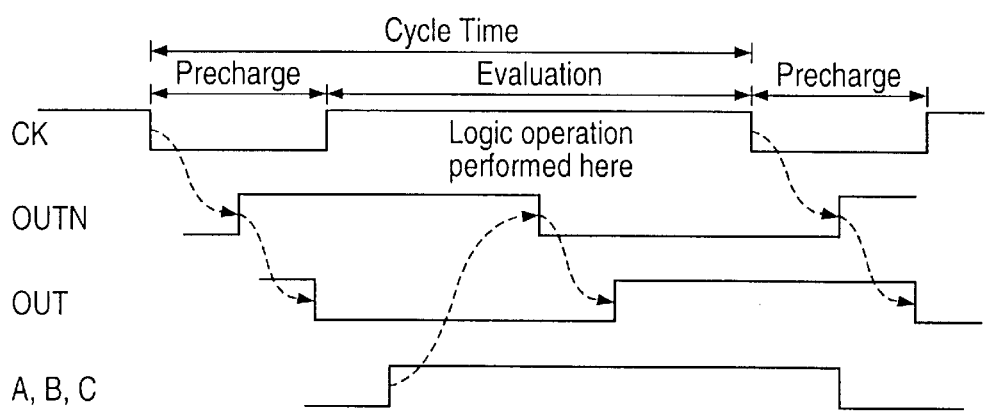
FIG. 2 is a timing diagram illustrative of the operation of a conventional dynamic logic gate.
Figure 3:
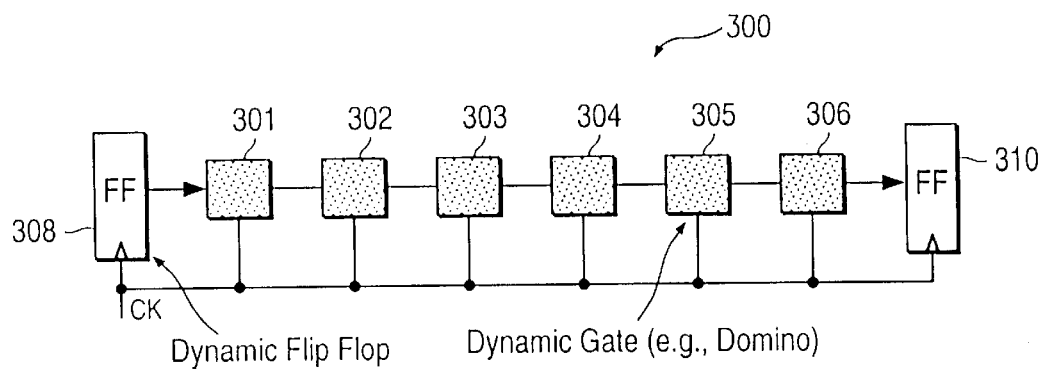
FIG. 3 is a block diagram of a conventional dynamic logic subcircuit for use in a single phase clocking scheme.
Figure 4:
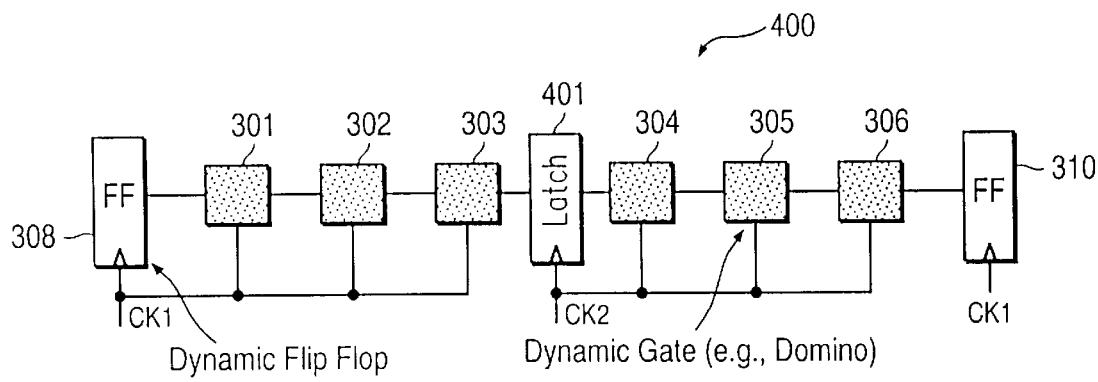
FIG. 4 is a block diagram of a conventional dynamic logic subcircuit for use in a non-overlapping two-phase clocking scheme.
Figure 5:
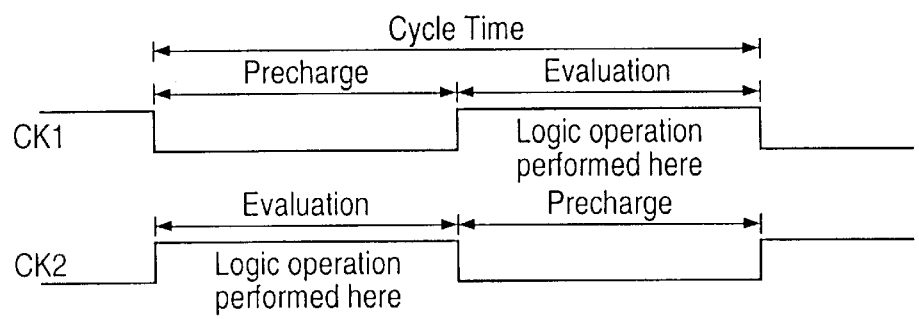
FIG. 5 is a timing diagram illustrating a conventional non-overlapping two-phase clocking scheme.
Figure 6:
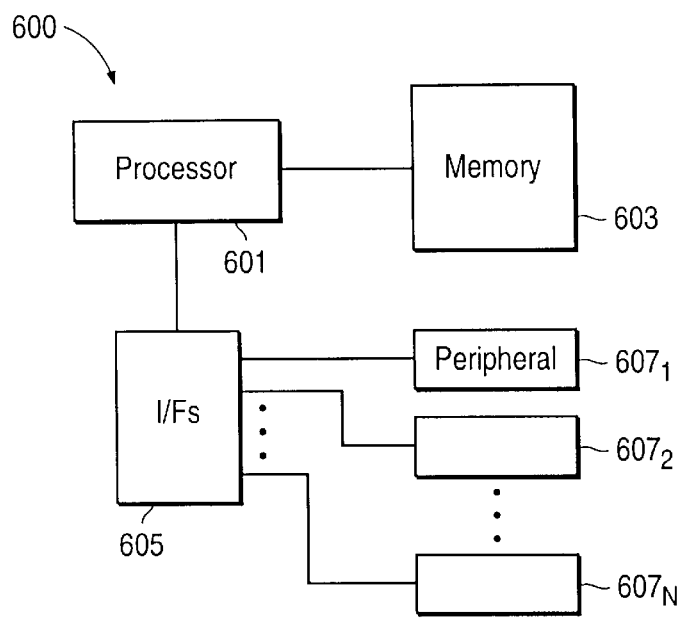
FIG. 6 is a block diagram of an electronic system including dynamic logic gates clocked using a non-blocking multiple-phase clocking system according to one embodiment of the present invention.

FIG. 6 is a block diagram of an electronic system 600 according to one embodiment of the present invention. The electronic system 600 includes in an integrated circuit 601 having dynamic logic gates clocked using a non-blocking multiple-phase clocking system (described below in conjunction with FIGS. 7–15), a memory 603, interfaces 605 and peripherals 607$_1$–607$_N$.

The electronic system 600 can be any type of electronic system. In this embodiment, the electronic system 600 is a computer system in which the integrated circuit 601 is a processor connected to the memory 603 and to interfaces 605. The processor can be any type of processor such as, for example, X86, Sparc®, Alpha®, MIPS®, HP®, and PowerPC® processors. The interfaces 605 are connected to peripherals $607_1$–$607_N$, thereby allowing the processor to interact with these peripherals. The memory 603 and the interfaces 605 can be any type of memory or interface for use in computer systems. Likewise, the peripherals can be any type of peripheral such as, for example, displays, mass storage devices, keyboards or any other type of input or input-output device.

Figure 7:
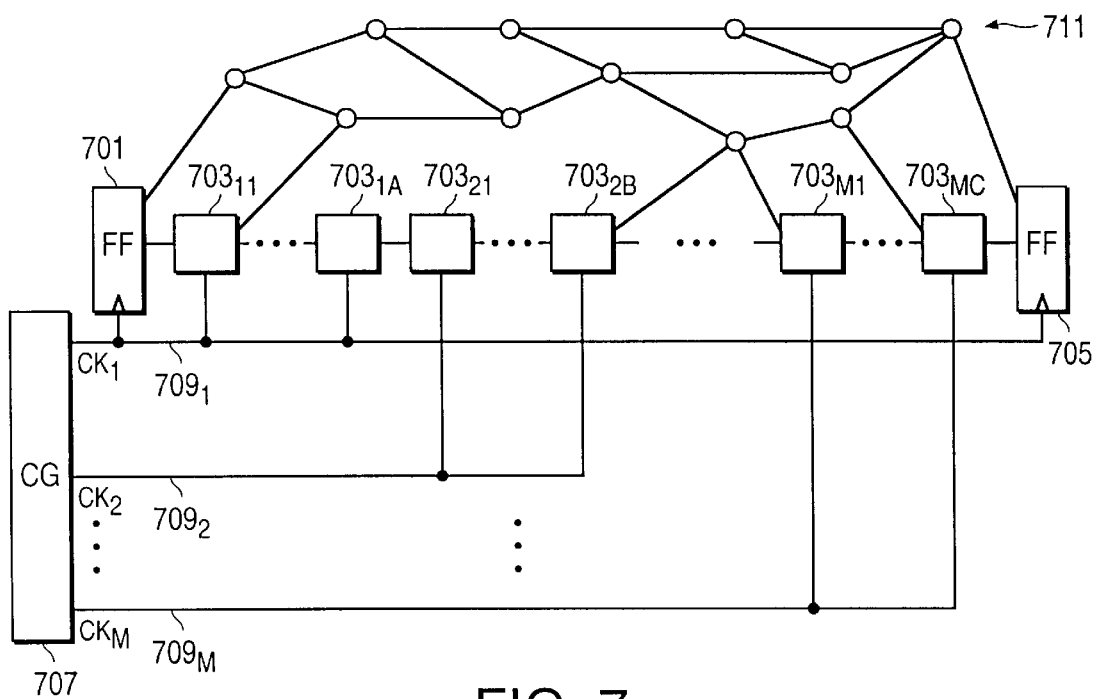
FIG. 7 is a block diagram of a dynamic logic subcircuit using a non-blocking multiple-phase clocking system, according to one embodiment of the present invention.

FIG. 7 is a block diagram of a generalized dynamic logic subcircuit 700 using a non-blocking multiple-phase clocking system according to one embodiment of the present invention. The subcircuit 700 includes a flip-flop 701 and M sets of dynamic logic gates. More specifically, the first set includes dynamic logic gates $703_{11}$–$703_{1A}$, the second set includes dynamic logic gates $703_{21}$–$703_{2B}$ and so on to the Mth set that includes dynamic logic gates $703_{M1}$–$703_{MC}$. Of course, in other embodiments, a set of dynamic logic may include a single dynamic logic gate. The variables M, A, B and C are integers greater than one. The subcircuit 700 also includes a second flip-flop 705 and a clock generator 707. It will be understood by those skilled in the art of dynamic logic circuits that the dynamic logic circuits $703_{11}$–$703_{MC}$ represent one logic path through the subcircuit 700. In addition, the subcircuit 700 may include other dynamic logic gates, for example, dynamic logic gates 711, in a multiple tree structure for providing desired logic functions.

The subcircuit 700 is interconnected as follows. The dynamic logic gates $703_{11}$–$703_{MC}$ are connected in series or cascade with the dynamic logic gate $703_{11}$ generating output signals that serve as input signals to (i.e., "driving") the dynamic logic gate $703_{12}$. Similarly, the dynamic logic gate $703_{12}$ drives the dynamic logic gate $703_{13}$ and so on, with the dynamic logic gate $703_{MC-1}$ driving the dynamic logic gate $703_{MC}$. The clock generator 707 is connected to provide clock signals with overlapping evaluation phases to the M sets of dynamic logic gates. In this embodiment, the first set of dynamic logic gates (i.e., gates $703_{11}$–$703_{1A}$) and the flip-flops 701 and 705 are connected to receive a clock signal $CK_1$ from the clock generator 707 through a line $709_1$. Similarly, the clock generator 707 provides a clock signal $CK_2$ to the second set of dynamic logic gates (i.e., gates $703_{21}$–$703_{2B}$) through a line $709_2$ and so on, with the clock generator 707 providing a clock signal $CK_M$ to the Mth set of dynamic logic gates through a line $709_M$.

Figure 8:
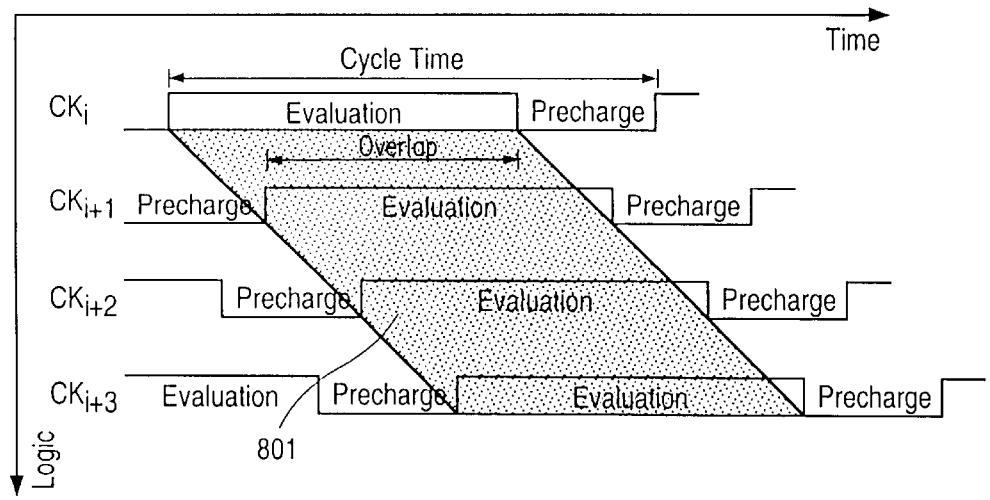
FIG. 8 is a timing diagram illustrating the clock signal timing of one embodiment of a non-blocking multiple-phase clocking system according to the present invention.

FIG. 8 is a timing diagram illustrating the timing of the clock signals generated by the clock generator 707 (FIG. 7). Thus, referring to FIGS. 7 and 8, the subcircuit 700 operates as follows with respect to the logic path defined by the dynamic logic gates $703_{11}$–$703_{MC}$. The clock generator 707 provides the clock signals $CK_1$ through $CK_M$ to the dynamic logic gates $703_{11}$–$703_{MC}$ so that relative to an arbitrary clock signal $CK_i$, the adjacent or next subsequent clock signal $CK_{i+1}$ lags the clock signal $CK_i$, by a predetermined time period. This delay causes the evaluation phases of the clock signals $CK_1$ and $CK_{i+1}$ to overlap. In this embodiment, the predetermined lag period between adjacent clock phases are equal, except that the lag period between the last clock signal and the next cycle time of the first clock cycle is different.

In this embodiment, each dynamic logic gate of the subcircuit 700 enters the evaluation phase when the logic gate's corresponding clock signal transitions to a logic high level and enters the precharge phase when the logic gate's clock signal transitions to a logic low level. The overlap time between clock signals $CK_i$ and $CK_{i+1}$ is defined herein as the time period between the rising edge of the clock signal $CK_{i+1}$ and the falling edge of the clock signal $CK_i$.

The clock generator 707 generates the next adjacent clock signal $CK_{i+2}$ lagging the clock signal $CK_{i+1}$ by a predetermined time period, defining an overlap time from the rising edge of the clock signal $CK_{i+2}$ and the falling edge of the clock signal $CK_{i+1}$. Likewise, the clock generator 707 generates the next adjacent clock signal $CK_{i+3}$ lagging the clock signal $CK_{i+2}$ with a predetermined delay, and so on until the last clock signal $CK_M$ is generated. Together, all of the overlap times form an evaluation region 801. As can been seen in FIG. 8, over the entire cycle time, at least one clock signal is in the evaluation phase. This feature allows an output signal that is generated by a dynamic logic gate in one evaluation phase to be used as an input signal to a dynamic logic gate in a subsequent evaluation phase. In this manner, the entire cycle time can be used by the subcircuit 700 to perform logic operations, which can significantly increase the speed of the subcircuit 700.

Figure 9A:
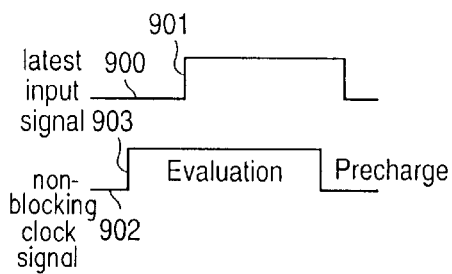
FIGS. 9A and B are timing diagrams respectively illustrating a blocking clock signal and a non-blocking clock signal.
Figure 9B:
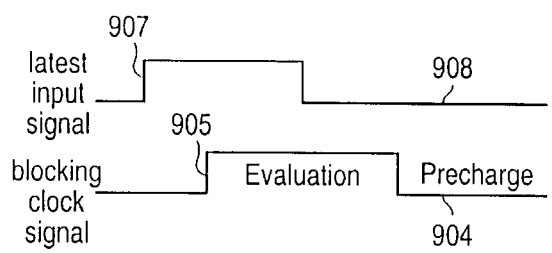

By assigning the clock signal received by a particular dynamic logic gate so that the operation is "non-blocking", the speed of the subcircuit 700 can be further increased. The term "non-blocking" is used herein to denote that the clock signal received by a dynamic logic gate enters the evaluation phase before the dynamic logic gate receives its latest arriving or critical input signal. FIG. 9A is a timing diagram illustrating a non-blocking clock signal. The input signal 900 is the critical signal received by the dynamic logic (not shown). The leading edge 901 of the critical input signal 900 occurs after the leading edge 903 (also a rising edge in this example) of the clock signal 902 received by the dynamic logic gate. Conversely, FIG. 9B illustrates a "blocking" clock signal 904. The leading edge 905 of the blocking clock signal 904 arrives at the dynamic logic gate (not shown) after the leading edge 907 of the latest arriving input signal 908.

Referring back to FIGS. 7 and 8, by assigning the clock signals to the dynamic logic gates $703_1$–$703_M$ in a non-blocking manner, each dynamic logic gate can evaluate the logic operation immediately upon receiving the latest input signal and need not "wait" for the evaluation phase to begin. It will be understood by those skilled in the art of dynamic logic that in FIG. 9A, the non-blocking time of the dynamic logic gate is zero (the term "non-blocking time" is used herein to refer to the time the evaluation phase must precede the arrival of the input signal to prevent blocking). If the non-blocking time is non-zero, then the leading edge of the clock signal must arrive a certain minimum time before the arrival of the input signal.

For a given clock frequency, the number, duty cycle and the evaluation overlap of the clock phases can be predetermined by the designer, depending on the timing characteristics of the dynamic logic gates, such as the minimum input signal pulse width, the propagation delay, precharge time and the reset time (i.e., the time required to precharge the dynamic logic gate to 50% of the VDD voltage) of each dynamic logic gate. For example, the clock frequency and precharge time determine the duty cycle of the clock phases. In addition, the clock frequency together with the reset time, propagation delay and minimum input signal pulse width of the dynamic logic gates determine the evaluation overlap, the number of clock phases and the maximum number of dynamic logic gates that can be in a logic path of the subcircuit 700. For example, the evaluation overlap must be long enough so that any output signal generated by a dynamic logic gate clocked during an arbitrary clock signal CK$_i$ has a pulse width at least as long as the minimum pulse width required by any dynamic logic gate clocked by the next adjacent clock signal Ck$_{i+1}$. When using clock phases that have identical duty cycles, once the overlap time is determined, the phase delay or lag between adjacent clock phases is also set. Then, the maximum number of phases is determined. More specifically, increasing the number of clock phases beyond the clock phase that overlaps the next cycle time of first clock phase by the minimum required overlap period provides no benefit.

Figure 10:
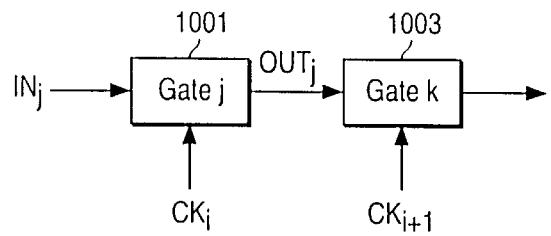
FIG. 10 is a block diagram of two dynamic logic gates in a dynamic logic subcircuit according to one embodiment of the present invention.

FIG. 10 is a block diagram of two dynamic logic gates 1001 and 1003 in a dynamic logic subcircuit 1000. The subcircuit 1000 is similar to the subcircuit 700 (FIG. 7), with the dynamic logic gates 1001 and 1003 representing any two of the dynamic logic gates in the subcircuit 1000. The dynamic logic gate 1001 is connected to receive a critical input signal INj from either a flip-flop or another dynamic logic gate (not shown). The dynamic logic gate 1001 is also connected to receive the clock signal CK$_i$. The dynamic logic gate 1001 generates an output signal OUTj as a logical function of its received input signal(s), which is received by the dynamic logic gate 1003. The dynamic logic gate 1003 is clocked by the adjacent clock signal CK$_{i+1}$. In this example, the output signal OUTj is also the critical input signal to the dynamic logic gate 1003. It will be understood by those skilled in the art of dynamic logic circuits that the input signals of the dynamic logic gate 1001 shown in FIG. 10 are the critical or last arriving signals, with all other input and output signals omitted for clarity. In one embodiment, the evaluation overlap is calculated according to the equation:

$$t_{CKovr} > (t_{pd_j} - t_{rst_j}) + t_{smin_k} \quad (1)$$

where $t_{CKovr}$ is the evaluation overlap period, $t_{pd_j}$ is the propagation delay of the dynamic logic gate 1001, $t_{rst_j}$ is the time needed to reset the dynamic logic gate 1001, and $t_{smin_k}$ is the minimum input signal pulse width required by the dynamic logic gate 1003 so that the dynamic logic gate 1003 may correctly evaluate the input signal. This equation is applied to all of the dynamic logic gates in the subcircuit 1000, with the worst case being used to determine the evaluation overlap period. In addition, because the propagation delay and reset time are load dependent, the worst case value for the term ($t_{pd_j} - t_{rst_j}$) is determined with different expected loadings. More specifically, for each expected loading, the difference ($t_{pd_j} - t_{rst_j}$) is calculated with both $t_{pd_j}$ and $t_{rst_j}$ under the particular loading and not the maximum $t_{pd_j}$ and the minimum $t_{rst_j}$, which would lead to an evaluation overlap that is too pessimistic.

Having a fixed number of clock phases with fixed placement of edges significantly simplifies the design of the clock distribution network. Further, the fixed clock phases avoids the need for adjustable clock edges, which are complex to design. Still further, once the timing of the clock signals or phases is determined, a simple algorithm, described below in conjunction with FIGS. 10 and 11, is used to assign the clock signals received by the dynamic logic gates 703$_1$–703$_M$ so as to be non-blocking.

Figure 11:
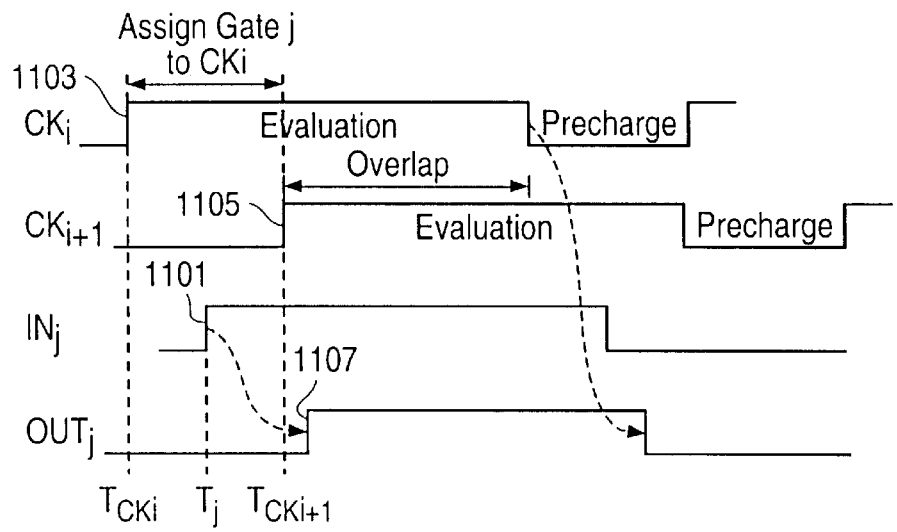
FIG. 11 is a timing diagram illustrating the assignment of clock signals to the dynamic logic gates depicted in FIG. 10.

FIG. 11 is a timing diagram illustrating the assignment of clock signals to the dynamic logic gates 1001 and 1003 (FIG. 10). In this embodiment of the present invention, the clock signals were assigned to the dynamic logic gate 1001 using the following algorithm. Assuming the non-blocking time is zero, assign the clock signal CK$_n$ to the dynamic logic gate 1001 if $$T_{CK_n} \leq Tj \leq T_{CK_{n+1}} \quad (2)$$

where $T_{CK_n}$ is the time that the leading edge of the clock signal CK$_n$ occurs, Tj is the time that the leading edge of the latest arriving input signal INj occurs, and $T_{CK_{n+1}}$ is the time that the leading edge of clock signal CK$_{n+1}$ occurs. Although in this example the leading edges of the clock and input signals are rising edges, in light of this disclosure, those skilled in the art of dynamic logic may design other embodiments in which the evaluation phases occur when the clock signals are at a logic low level without undue experimentation.

Referring to FIGS. 10 and 11, the leading edge 1101 of the latest arriving input signal INj occurs at a time Tj, which occurs after the leading edge 1103 of the clock signal CK$_i$ and before the leading edge 1105 of the clock signal CK$_{i+1}$. Accordingly, the timing of the input signal INj satisfies equation 1 for n=i, resulting in the clock signal CK$_i$ being assigned to the dynamic logic gate 1001.

Similarly, the leading edge 1107 of the output signal OUTj, received as a latest input signal by the dynamic logic gate 1003, occurs between the leading edge 1105 of the clock signal CK$_{i+1}$ and the leading edge of the clock signal CK$_{i+2}$ (not shown). Thus, the timing of the signal OUTj with regard to the dynamic logic gate 1003 satisfies equation 1 for n=i+1. Consequently, the clock signal CK$_{i+1}$ is assigned to the dynamic logic gate 1003. Not only does this algorithm ensure non-blocking clock assignment of critical signals, but the algorithm also ensures that the latest output signal generated by each dynamic logic gate will be valid for the dynamic logic gates receiving this latest output signal. More specifically, the "$\leq T_{CK_{n+1}}$" requirement of equation 2 ensures that the latest output signal will have at least the minimum required pulse width of the dynamic logic gates receiving this latest output signal.

Figure 12:
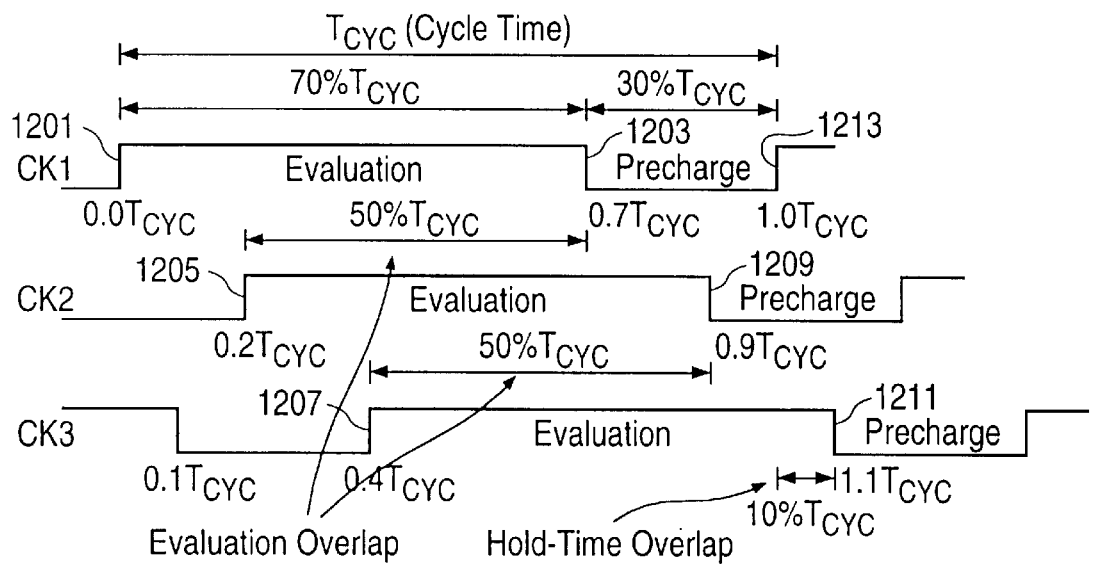
FIG. 12 is a timing diagram illustrating an example of a three-phase non-blocking clocking system according to one embodiment of the present invention.

FIG. 12 is a timing diagram illustrating an example of a three-phase non-blocking clocking system according to one embodiment of the present invention. In this example, the cycle time is equivalent to ten unit gate delays. The three clock signals were predetermined to have a duty cycle in which the precharge phase is 30% of the cycle time or 3u (where lu=one unit gate delay). Thus, the evaluation phase is 70% of the cycle time or 7u. As a result, for example, the leading edge 1201 of the clock signal CK1 occurs at time zero, while the trailing edge 1203 occurs at the time 7u. The overlap time was chosen to be 50% of the cycle time or 5u, resulting in a delay or lag of 20% of the cycle time (2u) between adjacent clock signals. Because of the 20% lag, the leading edge 1205 of the clock signal CK2 occurs at the time 2u, with the overlap time being the time period between the leading edge 1205 of the clock signal CK2 and the trailing edge 1203 of the clock signal CK1. The clock signal CK3 is generated to have a leading edge 1207 occurring at the time 4u, resulting in an overlap time with regard to the clock signal CK2 being the time period between the leading edge 1207 of the clock signal CK3 and the trailing edge 1209 of the clock signal CK2. In addition, this timing scheme results in an overlap between the evaluation phase of the last clock signal and the evaluation phase of the next cycle time of the first clock signal (referred to herein as the "hold time overlap") of 10% of the cycle time or 1u. More specifically, for this cycle time, the hold time overlap is the time period between the trailing edge 1211 of the clock signal CK3 and the leading edge 1213 of the next cycle time of the clock signal CK1. The hold time overlap must be large enough to ensure that any output signal generated by the dynamic logic gates in the last clock signal's evaluation phase can be correctly received by the flip-flop (e.g., the flip-flop 705 in FIG. 7).

The precharge time of 3u is typically more than large enough to precharge the dynamic logic gates for most types of dynamic logic gates. The 5u evaluation overlap time provides relatively large margin for valid transition of output signals across adjacent clock signals and accounting for clock signal skew and jitter. The hold time overlap of 1u is large enough to satisfy the hold time requirements of typical edge-triggered flip-flops in the presence of clock skew and jitter.

Figure 13:
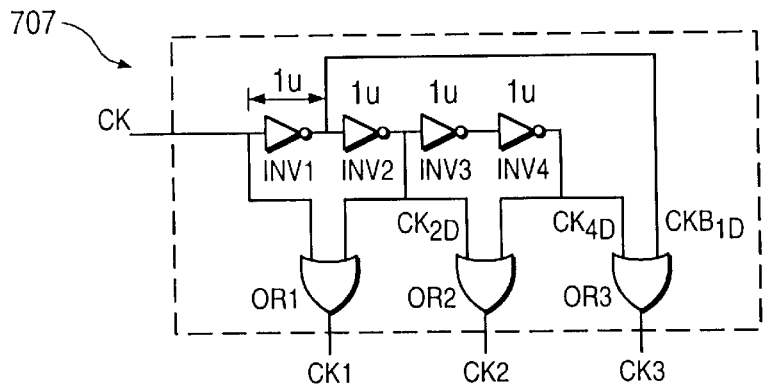
FIG. 13 is a schematic diagram of a clock generator circuit according to one embodiment of the present invention.
Figure 14:
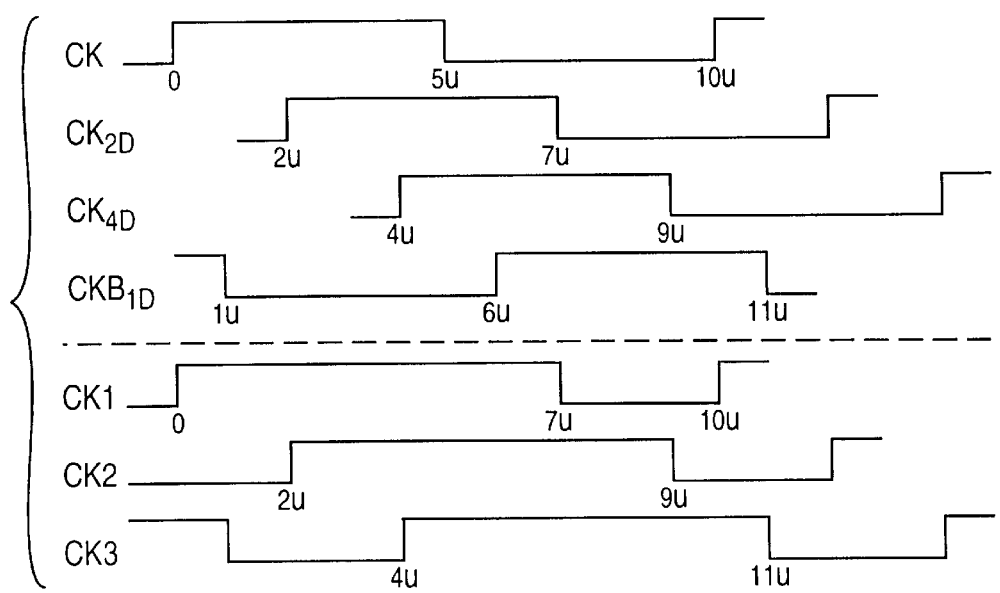
FIG. 14 is a timing diagram illustrative of the operation of the timing generator circuit depicted in FIG. 13.

FIG. 13 is a schematic diagram of one embodiment of the clock generator 707 (see FIG. 7) for generating the three phase clock system illustrated in FIG. 12. The clock generator 707 includes four inverters INV1–INV4 with a propagation delay of 1u each, and three two-input OR gates OR1–OR3. The four inverters are series-connected, with the inverter INV1 driving the inverter INV2 and so on. In addition, the inverter INV1 is connected to receive a standard 50% duty cycle clock signal CK with a cycle time of 10u. Consequently, the inverter INV1 outputs a signal $CKB_{1D}$ that is the complement of the clock signal CK delayed by 1u. Further, the inverter INV2 outputs a signal $CK_{2D}$ that is equivalent to the clock signal CK delayed by 2u relative to the clock signal CK. Similarly, the inverter INV4 outputs a signal $CK_{4D}$ that is equivalent to the clock signal CK delayed by 4u. The signals CK, $CK_{2D}$, $CK_{4D}$ and $CKB_{1D}$ are illustrated in FIG. 14.

The OR gate OR1 is connected to receive the clock signal CK and the delayed clock signal $CK_{2D}$ for the inverter INV2. Thus, the OR gate OR1 outputs a 70% duty cycle clock signal, which serves as the clock signal CK1 (see FIG. 12). For clarity, the clock signal CK1 is shown in FIG. 14 without the propagation delay from the OR gates.

The OR gate OR2 is connected to receive the delayed clock signals $CK_{2D}$ and $CK_{4D}$ from the inverters INV2 and INV4, respectively. Consequently, the OR gate OR2 outputs a 70% duty cycle clock signal that is delayed by 2u relative to the clock signal CK1, as shown without the OR gate delay in FIG. 14. This output signal serves as the clock signal CK2 (see FIG. 12).

The OR gate OR3 is connected to receive the delayed clock signal $CK_{4D}$ from the inverter INV4 and the delayed complemented clock signal $CKB_{1D}$ from the inverter INV1. As a result, the OR gate OR3 also outputs a 70% duty cycle clock signal that is delayed by 2u relative to the clock signal CK2 as shown in FIG. 14. In addition, because the trailing edge of the complemented clock signal $CKB_{1D}$ (i.e., which is generated by the leading edge of the next cycle time of the clock signal CK) is used to generate the trailing edge of the clock signal CK3, the hold time overlap is ensured to be 1u. More specifically, the leading and trailing edges of the clock signal CK3 are generated respectively as a function of the leading edge of the clock signal CK of the current cycle time and the leading edge of the clock signal CK of the next cycle time. This feature ensures that the clocking scheme will operate correctly at low frequencies, which is very important in testing synchronous systems. For example, if during operation the frequency of the clock signal CK were decreased by a factor of two (doubling the cycle time), the hold time overlap would be guaranteed to be positive and equal to 1u (in this case, one inverter delay). Thus, the hold time overlap is frequency independent.

Although the clock signals CK1–CK3 are shown in FIG. 14 without the OR gate delays, the OR gate delay may be accounted for by simply shifting the clock signals CK1–CK3 later in time by an amount equal to the OR gate delay. Of course, the relative timing between the clock signals CK1–CK3 remains the same.

Figure 15:
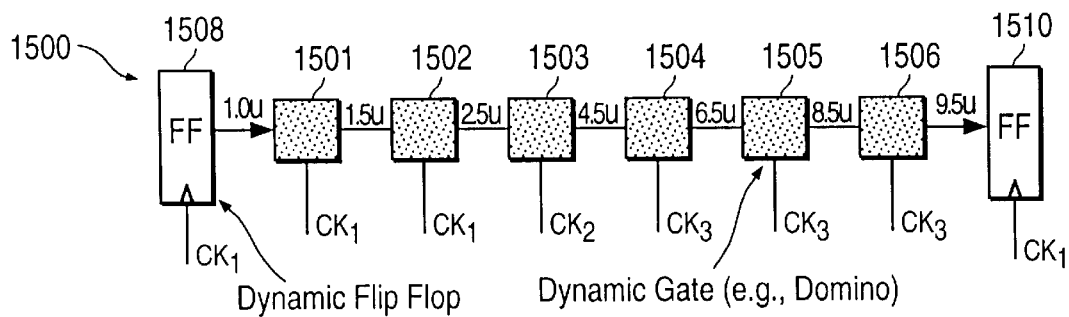
FIG. 15 is a block diagram of an exemplary dynamic logic subcircuit using a non-blocking three-phase clocking system according to one embodiment of the present invention and FIG. 16 is a block diagram of an exemplary dynamic logic subcircuit illustrating a skipped clock phase.

FIG. 15 is a block diagram of an exemplary dynamic logic subcircuit 1500 using the three phase clocking system depicted in FIG. 12. In this example, the subcircuit 1500 includes six cascaded dynamic logic gates 1501–1506 of the domino type, although other types of dynamic logic gates may be used in other embodiments. Similar to a conventional dynamic logic gate subcircuit, a flip-flop 1508 is connected to provide input signal(s) to the dynamic logic gate 1501 (i.e., the first dynamic logic gate in the cascade). In addition, a flip-flop 1510 is connected to received output signal(s) from the dynamic logic gate 1506 (i.e., the last dynamic logic gate in the cascade). The flip-flops 1508 and 1510 are also connected to receive the clock signal CK1. Then, before assigning clock signals to the dynamic logic gates, the arrival times of the critical (i.e., last arriving) signals for each dynamic logic gate are determined, assuming non-blocking clock assignment. In this example, the arrival times of the critical signals for the dynamic logic gates 1501–1506 are 1.0u, 1.5u, 2.5u, 4.5u, 6.5u, and 8.5u, respectively. The arrival times of the leading edges of the clock signals CK1–CK3 were predetermined to be 0.0u, 2.0u and 4.0u (see FIG. 12). Then, applying equation 1, the clock signal CK1 is assigned to the dynamic logic gates 1501 and 1502 because these dynamic logic gates have latest input signal arrival times that are between 0.0u (clock signal CK1) and 2.0u (clock signal CK2). Similarly, the clock signal CK2 is assigned to the dynamic logic gate 1503 because this dynamic logic gate has a critical signal arrival time of 2.5u, which is between 2.0u (clock signal CK2) and 4.0u (clock signal CK3). Likewise, the clock signal CK3 is assigned to the logic gates 1504–1506 because these dynamic logic gates have critical signal arrival times of 4.5u, 6.5u, and 8.5u respectively, which is between 4.0u (clock signal CK3) and the end of the cycle time at 10.0u.

Figure 16:
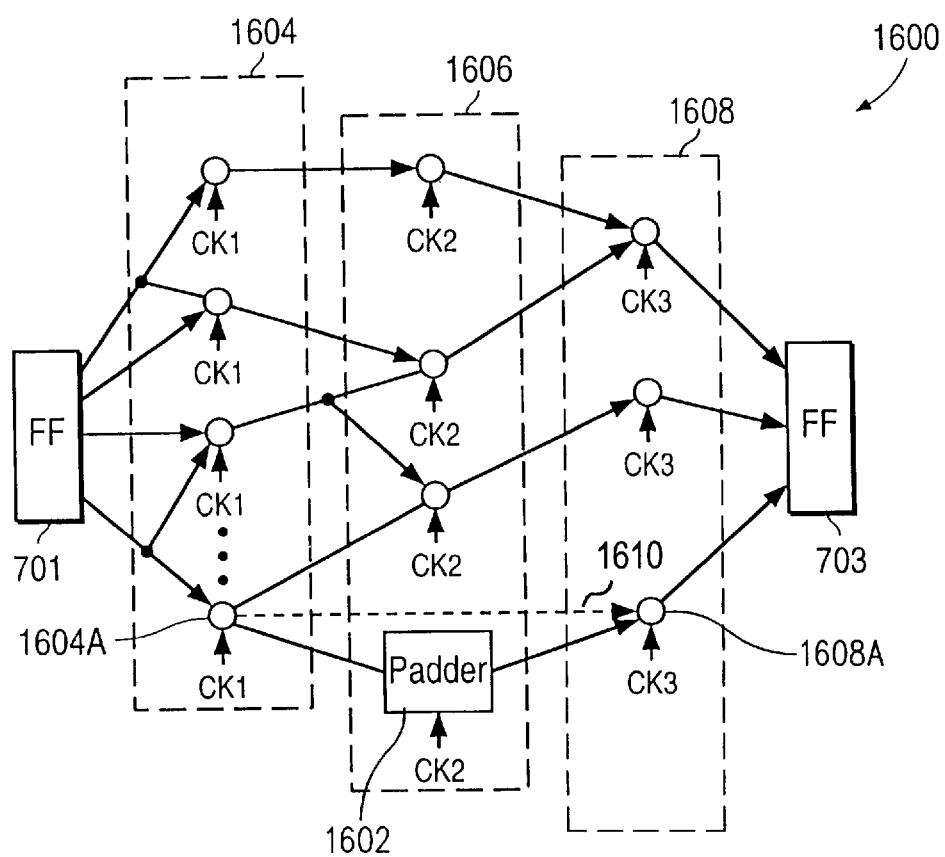

FIG. 16 is a block diagram of a dynamic logic gate subcircuit 1600 with a padder gate 1602 to avoid skipping a clock phase. The padder gate 1602 is a dynamic non-inverting delay gate that merely passes the received input signal to its output lead. In this example, the subcircuit 1600 includes dynamic logic gates 1604 connected to receive the clock signal CKI and input signals from the flip-flop 701. In this example, additional dynamic logic gates 1606, as well as the padder gate 1602, are coupled to receive the output signals from the dynamic logic gates 1604 and the clock signal CK2. The padder gate 1602 and the dynamic logic gates 1606 are coupled to provide output signals to dynamic logic gates 1608, which are clocked by the clock signal CK3. The dynamic logic gates 1604, 1606 and 1608 were assigned the clock signals in accordance with equation 2.

However, as indicated by the dashed line 1610, the output lead of the dynamic logic gate 1604A was originally connected to the input lead of the dynamic logic gate 1608A. Thus, in the logic path leading from the dynamic logic gate 1604A to the dynamic logic gate 1608A, the clock phase CK2 was skipped. Because a clock phase was skipped, the output signal provided by the dynamic logic gate 1604A may not meet the minimum input signal pulse width required by the dynamic logic gate 1608A. Thus, the padder gate 1602 is inserted to receive the output signal from the dynamic logic gate 1604A and propagate this output signal unchanged to the dynamic logic gate 1608A, after a delay. Because the padder gate 1602 is clocked by the clock phase CK2, the output signal generated by the padder gate 1602 is ensured to meet the minimum pulse width requirement of the dynamic logic gate 1608A. In accordance with the present invention, whenever the clock assignment algorithm causes a skipped clock phase in a logic path, a padder gate is inserted and coupled to receive the skipped clock phase.

The embodiments of the non-blocking multiple-phase clocking system described above are illustrative of the principles of this invention and are not intended to limit the invention to the particular embodiments described. For example, different implementations of the clock generator can be used, along with different duty cycles and lag times, to optimize the performance of the dynamic logic subcircuit. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for providing clock signals to a circuit including a plurality of only interconnected dynamic logic gates, a first flip-flop coupled to provide one or more input signals to the plurality of only interconnected dynamic logic gates and a second flip-flop coupled to receive one or more output signals from the plurality of only interconnected dynamic logic gates, the method comprising:

clocking a first dynamic logic gate of the plurality of only interconnected dynamic logic gates with a first clock signal; and clocking a second dynamic logic gate of the plurality of only interconnected dynamic logic gates with a second clock signal, said second clock signal lagging said first clock signal, wherein, within one cycle time, an evaluation phase of said first clock signal overlaps an evaluation phase of said second clock signal by a first evaluation overlap time period; and clocking a third dynamic logic gate of the plurality of only interconnected dynamic logic gates with a third clock signal, said third clock signal lagging said second clock signal, wherein, within one cycle time, said evaluation phase of said second clock signal overlaps an evaluation phase of said third clock signal by a second evaluation overlap time period.

2. The method of claim 1 wherein, within one cycle time, said first dynamic logic gate of the plurality of only interconnected dynamic logic gates receives a leading edge of a latest arriving input signal after receiving a leading edge of said first clock signal.

3. The method of claim 2 wherein, within one cycle time, said first dynamic logic gate of the plurality of only interconnected dynamic logic gates receives said leading edge of said latest input signal before a leading edge of said second clock signal.

4. The method of claim 1 wherein said first evaluation overlap time period has a duration at least as great as a minimum input signal pulse width of a kth dynamic logic gate, summed with a propagation delay of a (k−1)th dynamic logic gate and minus a reset time of said (k−1)th dynamic logic gate, k being an integer greater than one.

5. The method of claim 1 wherein said first evaluation overlap time period is predetermined as a duration having a maximum value for any kth and (k−1)th dynamic logic gates in said plurality of only interconnected dynamic logic gates.

6. The method of claim 1 wherein i clock signals are provided to the plurality of only interconnected dynamic logic gates, i being an integer greater than one, each clock signal of said i clock signals having overlapping logic high levels portions, said i clock signals including said first, second, and third clock signals, wherein each dynamic logic gate is connected to receive one of said i clock signals so that, within one cycle time, each dynamic logic gate receives a leading edge of a latest arriving input signal after a leading edge of the clock signal received by the dynamic logic gate but before any subsequently occurring leading edge of said i clock signals, i being an integer greater than one.

7. The method of claim 6 wherein each of said i clock signals has a substantially identical duty cycle.

8. The method of claim 7 wherein adjacent clock signals of said i clock signals have substantially identical lag periods, except for an initial clock signal of said i clock signals and a last clock signal of said i clock signals.

9. A structure for providing clock signals to a circuit including a plurality of interconnected dynamic logic gates, a first flip-flop coupled to provide one or more input signals to the plurality of interconnected dynamic logic gates and a second flip-flop coupled to receive one or more output signals from the plurality of interconnected dynamic logic gates, the structure comprising:

means for providing a first clock signal to the first and second flip-flops and a first dynamic logic gate of the plurality of interconnected dynamic logic gates;

means for providing a second clock signal to a second dynamic logic gate of the plurality of interconnected dynamic logic gates, said second clock signal lagging said first clock signal, wherein, within one cycle time, an evaluation phase of said first clock signal overlaps an evaluation phase of said second clock signal; and means for providing a third clock signal to a third dynamic logic gate of said plurality of interconnected dynamic logic gates, said third clock signal lagging said second clock signal, wherein, within one cycle time, said evaluation phase of said second clock signal overlaps an evaluation phase of said third clock signal.

10. The structure of claim 9 wherein, within one cycle time, said first dynamic logic gate of the plurality of interconnected dynamic logic gates receives a leading edge of a latest input signal after receiving a leading edge of said first clock signal.

11. The structure of claim 9 wherein, within one cycle time, said first dynamic logic gate of the plurality of interconnected dynamic logic gates receives said leading edge of said latest input signal before a leading edge of said second clock signal.

12. The structure of claim 9 wherein said first dynamic logic gate of the plurality of interconnected dynamic logic gates, in outputting an output signal, has a propagation delay greater than a time period defined by said leading edge of said latest input signal and said leading edge of said second clock signal.

13. The structure of claim 12 wherein said propagation delay is less than an overlap time period defined by said leading edge of said second clock signal and a trailing edge of said first clock signal.

14. The structure of claim 13 wherein said overlap time period has a duration at least as great as said propagation delay summed with a largest hold time required of any dynamic logic gate of the plurality of interconnected dynamic logic gates coupled to receive said output signal of said first dynamic logic gate of the plurality of interconnected dynamic logic gates.

15. A circuit comprising:

a clock generator, wherein said clock generator is configured to output k clock signals $CK_1, \ldots, CK_k$, k being an integer greater than one, a clock period of said clock signal $CK_1$ defining a cycle time, said k clock signals each having a precharge phase and an evaluation phase, a leading edge of each of said k clock signals initiating each said evaluation phase, wherein the leading edge of a clock signal $CK_i$ occurs between the leading edges of clock signals $CK_{i-1}$ and $CK_{i+1}$, i being an integer within the range of one and k, inclusive, so that said evaluation phases having overlapping portions;

a first flip-flop coupled to receive one of said k clock signals;

a plurality of cascaded dynamic logic gates, each coupled to receive one of said k clock signals, wherein said plurality of cascaded dynamic logic gates includes:
   a first dynamic logic gate coupled to receive an output signal from said first flip-flop, and
   a last dynamic logic gate coupled to receive an input signal that is dependent from an output signal from said first dynamic logic gate; and a second flip-flop coupled to receive an output signal from said last dynamic logic gate wherein, within one cycle time, each dynamic logic gate of said plurality of cascaded dynamic logic gates is configured to receive the clock signal $CK_i$ so that this dynamic logic gate receives a leading edge of a latest arriving input signal after the leading edge of the clock signal $CK_i$ occurs and before the leading edge of the clock signal $CK_{i+1}$ occurs.

16. The circuit of claim 15 wherein an overlap time period, defined by said leading edge of said clock signal $CK_{i+1}$ and a trailing edge of said clock signal $CK_i$, has a duration greater than a minimum input signal pulse width required of any dynamic logic gate of the plurality of cascaded dynamic logic gates.

17. A method for providing clock signals to a circuit including a plurality of interconnected dynamic logic gates, a first flip-flop coupled to provide one or more input signals to the plurality of interconnected dynamic logic gates and a second flip-flop coupled to receive one or more output signals from the plurality of interconnected dynamic logic gates, the method comprising:
   clocking a first dynamic logic gate of the plurality of interconnected dynamic logic gates with a first clock signal; and
   clocking a second dynamic logic gate of the plurality of interconnected dynamic logic gates with a second clock signal, said second clock signal lagging said first clock signal, wherein, within one cycle time, an evaluation phase of said first clock signal overlaps an evaluation phase of said second clock signal by a first evaluation overlap time period having a duration at least as great as a minimum input signal pulse width of an kth dynamic logic gate, summed with a propagation delay of a (k−1)th dynamic logic gate and minus a reset time of said (k−1)th dynamic logic gate, k being an integer greater than one.

18. A structure for providing clock signals to a circuit including a plurality of interconnected dynamic logic gates, a first flip-flop coupled to provide one or more input signals to the plurality of interconnected dynamic logic gates and a second flip-flop coupled to receive one or more output signals from the plurality of interconnected dynamic logic gates, the structure comprising:
   means for providing a first clock signal to the first and second flip-flops and a first dynamic logic gate of the plurality of interconnected dynamic logic gates; and
   means for providing a second clock signal to a second dynamic logic gate of the plurality of interconnected dynamic logic gates, said second clock signal lagging said first clock signal, wherein, within one cycle time, an evaluation phase of said first clock signal overlaps an evaluation phase of said second clock signal wherein said first dynamic logic gate of the plurality of interconnected dynamic logic gates, in outputting an output signal, has a propagation delay greater than a time period defined by said leading edge of said latest input signal and said leading edge of said second clock signal.

19. The structure of claim 18 wherein said propagation delay is less than an overlap time period defined by said leading edge of said second clock signal and a trailing edge of said first clock signal.

20. The structure of claim 19 wherein said overlap time period has a duration at least as great as said propagation delay summed with a largest hold time required of any dynamic logic gate of the plurality of interconnected dynamic logic gates coupled to receive said output signal of said first dynamic logic gate of the plurality of interconnected dynamic logic gates.

* * * * *